(12) United States Patent
Hankui et al.

(10) Patent No.: US 7,990,747 B2
(45) Date of Patent: Aug. 2, 2011

(54) SEMICONDUCTOR CHIP AND SEMICONDUCTOR DEVICE

(75) Inventors: Eiji Hankui, Tokyo (JP); Toshihide Kuriyama, Tokyo (JP); Hideki Sasaki, Tokyo (JP); Muneo Fukaishi, Tokyo (JP)

(73) Assignee: NEC Corporation, Tokyo (JP)

(*) Notice: Subject to any disclaimer, the term of this patent is extended or adjusted under 35 U.S.C. 154(b) by 113 days.

(21) Appl. No.: 12/529,443

(22) PCT Filed: Feb. 29, 2008

(86) PCT No.: PCT/JP2008/053612
§ 371 (c)(1),
(2), (4) Date: Oct. 13, 2009

(87) PCT Pub. No.: WO2008/111409
PCT Pub. Date: Sep. 18, 2008

(65) Prior Publication Data
US 2010/0097159 A1    Apr. 22, 2010

(30) Foreign Application Priority Data

Mar. 9, 2007 (JP) ................................ 2007-060352

(51) Int. Cl.
*G11C 5/06* (2006.01)
(52) U.S. Cl. .......................................... 365/63; 327/419
(58) Field of Classification Search .................. None
See application file for complete search history.

(56) References Cited

U.S. PATENT DOCUMENTS

| | | | | |
|---|---|---|---|---|
| 7,738,312 | B2 * | 6/2010 | Shimano et al. | 365/230.05 |
| 7,906,846 | B2 * | 3/2011 | Hoshino et al. | 257/724 |
| 2009/0065871 | A1 * | 3/2009 | Lin et al. | 257/368 |

FOREIGN PATENT DOCUMENTS

| | | |
|---|---|---|
| JP | 56-002662 A | 1/1981 |
| JP | 60-246654 A | 12/1985 |
| JP | 62-020362 A | 1/1987 |
| JP | 5-190770 A | 7/1993 |
| JP | 8-241961 A | 9/1996 |
| JP | 9-504908 A | 5/1997 |
| JP | 2006019328 A | 1/2006 |
| WO | 9966557 A | 12/1999 |

OTHER PUBLICATIONS

International Search Report for PCT/JP2008/053612 mailed May 20, 2008.

* cited by examiner

*Primary Examiner* — Cassandra Cox

(57) ABSTRACT

There are provided a semiconductor device and a semiconductor chip, in which the interconnection is made to be highly reliable by stacking three or more layers of chips without contact therebetween. A semiconductor chip of the present invention comprises a first signal transmission circuit, a silicon substrate on which a first changeover switch is formed, and an interconnection layer on which a first capacitive-coupling upper electrode is formed, wherein a first capacitive-coupling lower electrode is additionally formed on the rear surface of the silicon substrate through a first via hole that penetrates the silicon substrate and, whereas the first capacitive-coupling upper electrode is directly connected to the first signal transmission circuit, the first capacitive-coupling lower electrode is connected to the first signal transmission circuit through the first via hole and through the first changeover switch.

16 Claims, 14 Drawing Sheets

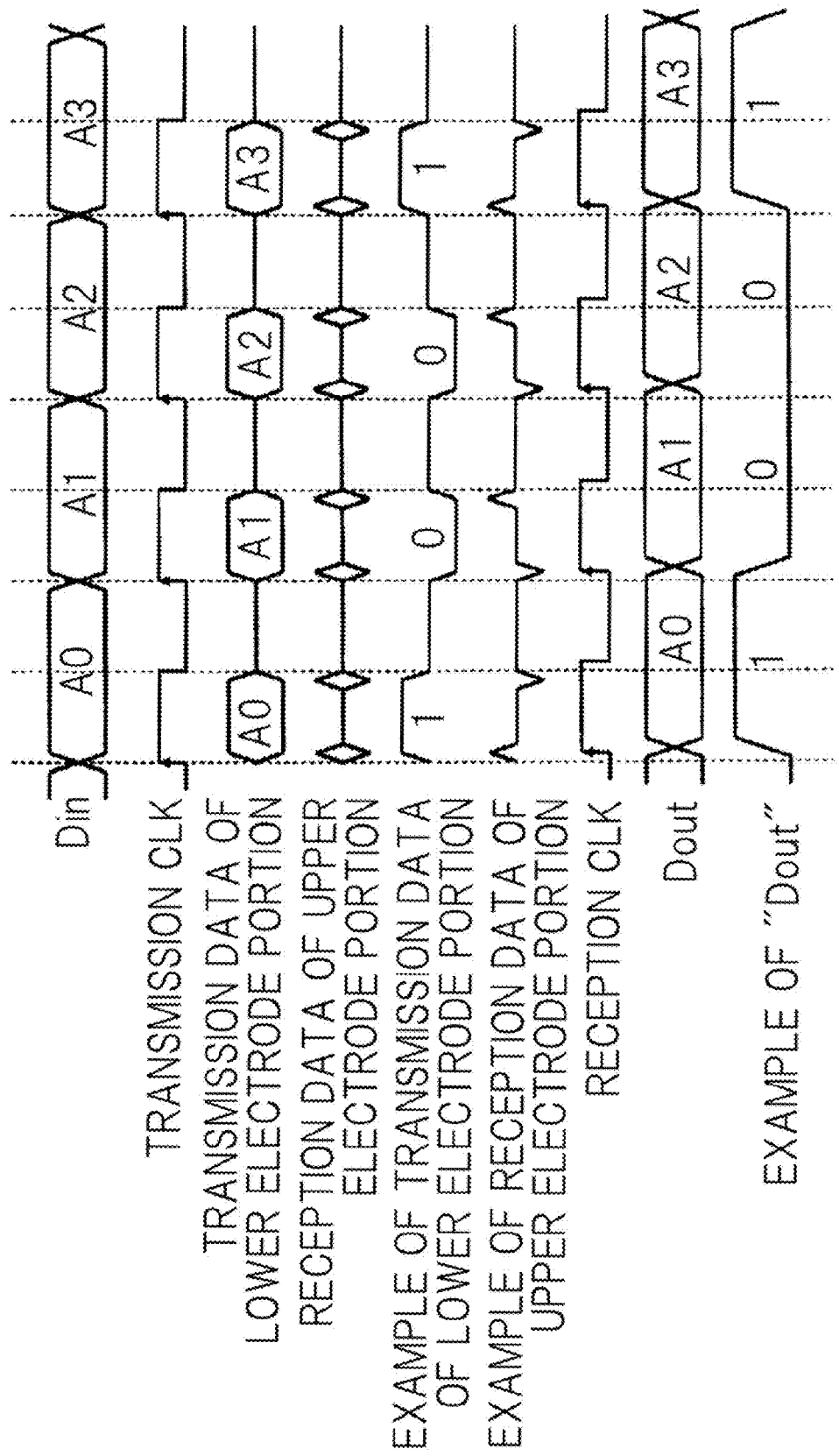

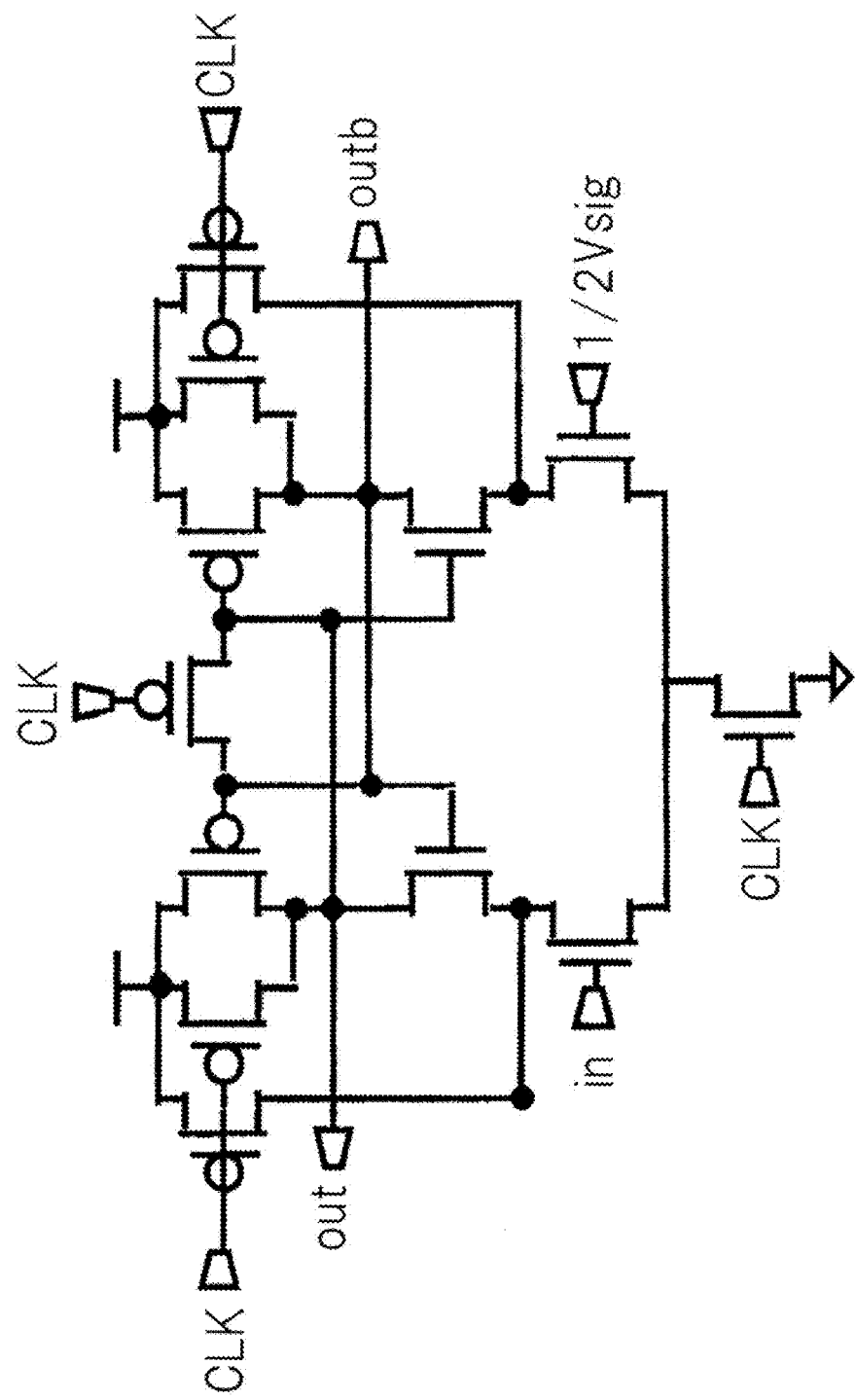

SEMICONDUCTOR CHIP AND SEMICONDUCTOR DEVICE

TECHNICAL FIELD

The present invention relates to a semiconductor device for performing signal transmission between chips or between a chip and a package and the semiconductor chips thereof and, more particularly, to a semiconductor device for contactlessly performing signal transmission among a plurality of chips wherein a plurality of chips are stacked in a layered manner (three-dimensional manner) and the semiconductor chips thereof.

BACKGROUND ART

In order to meet demands for increasing the speed and capacity of data transmission among a plurality of semiconductor chips and for reducing the packaging area of a semiconductor device, a variety of semiconductor devices wherein a plurality of semiconductor chips are stacked have been realized. Of these semiconductor devices, there is known a semiconductor device having a configuration in which electrodes formed on a chip are closely arranged contactlessly and oppositely to each other and inter-chip signal transmission is performed by means of capacitive coupling between the two electrodes. In this configuration, contact failure that often occurs when electrodes are brought into contact with each other, presents no problem. For this reason, this configuration is expected to come into practical use for the connection between semiconductor chips that requires multitude of electrodes, particularly among a plurality of CPUs, between a CPU and a memory, and among a plurality of memories, and for a semiconductor device in which these semiconductor chips are stacked.

FIG. 1 illustrates a typical semiconductor device for performing contactless signal transmission, wherein electrode A and electrode B are formed on the circuit surfaces of chip A and chip B, respectively, adjacently oppositely to each other. When electrode A is assumed to be a driver and electrode B is assumed to be a receiver, then electrostatic capacitance is present between the two electrodes, causing the two electrodes to capacitively couple with each other. That is, electrical lines of force generated from electrode A at this time reach electrode B, thereby placing the two electrodes in a state of being electrically coupled with each other (capacitive coupling). Consequently, a signal exchange is made from electrode A to electrode B.

In this related art, however, signal transmission among three or more chips is not possible, though signal transmission between opposed chips, i.e., one-to-one inter-chip transmission, is possible. When a signal is transmitted from lowermost-layer chip A to uppermost-layer chip C in cases where conventional chips are simply stacked in a three-dimensional manner as illustrated in FIG. 2, assuming, for example, that the chips are configured using a commonly-used semiconductor substrate (for example, a silicon substrate), then electric fields transmitted from the lowermost layer to the uppermost layer attenuate due to the effect of conductive property (loss) that the substrate of chip B located in an intermediate layer has. Therefore, it has been difficult to adequately perform signal transmission between chip A and chip C.

Hence, in order to enable a signal transmission among three or more chips, Patent documents 1 and 2 disclose a stacked electrical circuit in which a conductive region for penetrating through the front and back sides of a silicon substrate is provided and a signal transmission is performed with the mode thereof categorized into (1) a case where a signal from a wafer stacked on an upper side is received; (2) a case where a signal is transmitted to a wafer stacked on an upper side; (3) a case where a signal from a wafer stacked on a lower side is received; and (4) a case where a signal is transmitted to a wafer stacked on a lower side.

In addition, Patent document 3 discloses a three-layer modular electronic system, though the system is intended not for signal transmission among three or more chips but for signal transmission between two chips. In the system, electrodes are provided on upper and lower sides between the chips and a dielectric material substrate, in which an interconnection that penetrates the electrodes is formed, is sandwiched between the electrodes.

Patent document 1: Japanese Patent Laid-Open No. 56-002662
Patent document 2: Japanese Patent Laid-Open No. 62-020362
Patent document 3: Published Japanese translations of PCT international publication No. 09-504908

DISCLOSURE OF THE INVENTION

Problems to be Solved by the Invention

Patent documents 1 and 2 do not disclose any specific exemplary embodiments with regard to circuits for performing transmission/reception and switching signals between the upper and lower sides. Accordingly, although a contactless method is employed, theses patent documents could not achieve an increase in the speed and capacity of inter-chip data transmission and a reduction in the packaging size of a semiconductor device. In addition, although Patent document 3 illustrates in FIG. 8 an embodiment in which a one-to-many connection is made between chips by using an interconnection within the dielectric material substrate, the exemplary embodiment suffers from a problem in which the operation speed decreases because a circuit of branch destination serves as a load on the circuit operation.

It is an object of the present invention to provide a semiconductor device and a semiconductor chip, which are constructed to have a high reliable interconnection by stacking three or more layers of chips without contacts therebetween, wherein for the semiconductor chip and the semiconductor device, there is a particularly strong demand to increase the speed and capacity of data transmission among a plurality of CPUs, between a CPU and a memory, and among a plurality of memories and the like, and there is a particularly strong demand to reduce the size of the semiconductor device.

Means to Solve the Problems

A semiconductor chip according to the present invention includes a silicon substrate on which a first signal transmission circuit and a first changeover switch are formed; a wiring layer formed on the silicon substrate; and a first capacitive-coupling upper electrode formed on the wiring layer; wherein a first capacitive-coupling lower electrode is additionally formed on the rear surface of the silicon substrate through a first via hole penetrating the silicon substrate, the first capacitive-coupling upper electrode is directly connected to the first signal transmission circuit, and the first capacitive-coupling lower electrode is connected to the first signal transmission circuit through the first via hole and the first changeover switch.

A semiconductor device according to the present invention comprises a semiconductor chip including a silicon substrate on which a first signal transmission circuit and a first changeover switch are formed; an interconnection layer formed on the silicon substrate; and a first capacitive-coupling upper electrode formed on the interconnection layer; wherein the first capacitive-coupling lower electrode is additionally formed on the rear surface of the silicon substrate through a first via hole that penetrates the silicon substrate, the first capacitive-coupling upper electrode is directly connected to the first signal transmission circuit, and the first capacitive-coupling lower electrode is connected to the first signal transmission circuit through the first via hole and the first changeover switch.

Advantages of the Invention

According to the present invention, in a semiconductor device comprising three or more layers of semiconductor chips, a signal transmission between respective two semiconductor chips is controlled and a signal transmission between predetermined electrodes within predetermined semiconductor chips is realized. In addition, since a signal is transmitted through a capacitive coupling, there is no need to ensure electrical conductivity as in the case of contact-type electrodes, thereby increasing the tolerance of positioning accuracy between semiconductor chips.

BRIEF DESCRIPTION OF THE DRAWINGS

FIG. 20 is a schematic view illustrating a timing chart of a transmitter/receiver circuit of the first exemplary embodiment.

FIG. 21 is a block diagram illustrating a sampling latch-type receiver circuit as an example of a receiver circuit of the first exemplary embodiment.

Figure 1:
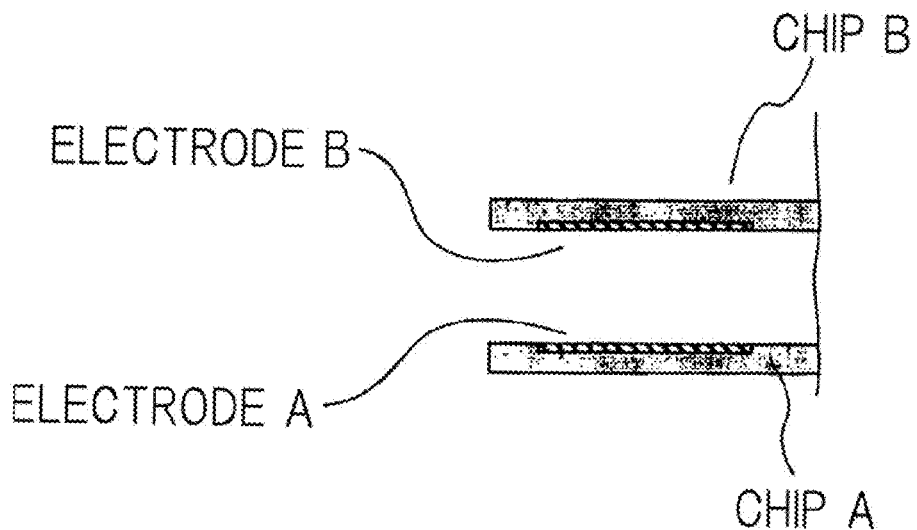
FIG. 1 is a cross-sectional view illustrating the configuration of a related semiconductor device for performing signal transmission by means of capacitive coupling between two chips.
Figure 2:
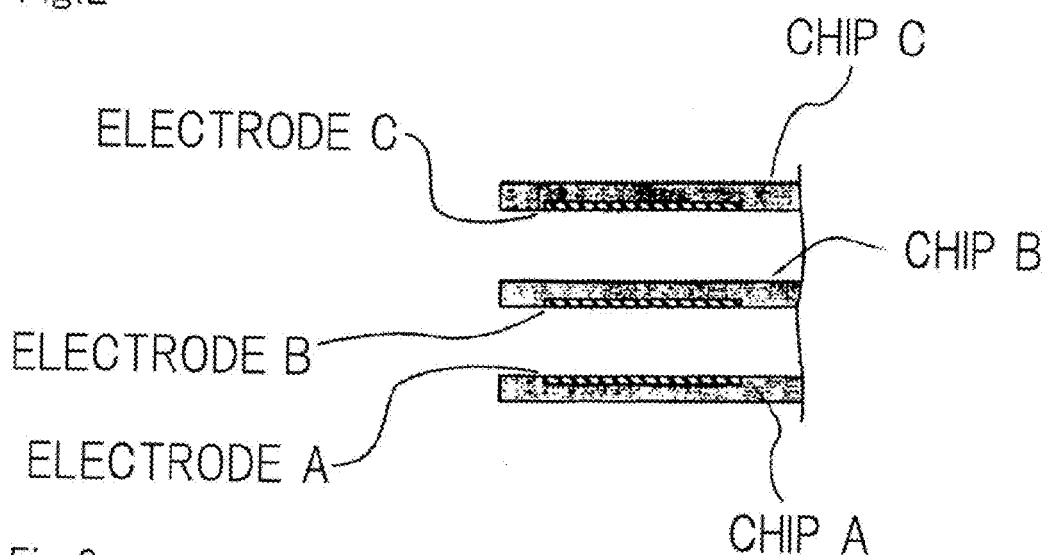
FIG. 2 is a cross-sectional view illustrating the configuration of a related semiconductor device for performing signal transmission by means of capacitive coupling among three chips.

DESCRIPTION OF SYMBOLS 1 semiconductor device
2a, 2b, 2c semiconductor chip
3a, 3b, 3c silicon substrate
4a, 4b, 4c interconnection layer
5a, 5b adhesion layer
6a, 6b, 6c, 6d, 6e, 6f transmitter/receiver circuit
7, 7a, 7b, 7c, 7d, 11a, 11b, 11c, 11d, 12a, 12b, 12c, 12d, 12e, 12f, 12g, 12h, 7A, 7B, 7C, 7D, 7A1, 7B1, 7C1, 7A2, 7B2, 7C2, 17A, 17B, 17C switch
8a, 8b, 8c, 8d, 8e, 8f, 8g, 8h electrode pad
9, 9a, 9b through-via hole
10 terminal leading to internal circuit
10A contact point
13A, 13B, 13C, 13D, 15A1, 15B1, 15C1, 15A2, 15B2, 15C2 amplifier
14A, 14B, 14C, 14D, 16A1, 16B1, 16C1, 16A2, 16B2, 16C2 amplifier with switch
18 transmission buffer
19 reception buffer, sampling latch

BEST MODE FOR CARRYING OUT THE INVENTION

Exemplary embodiments of a semiconductor device according to the present invention will be described in detail with reference to the drawings.

Figure 3:
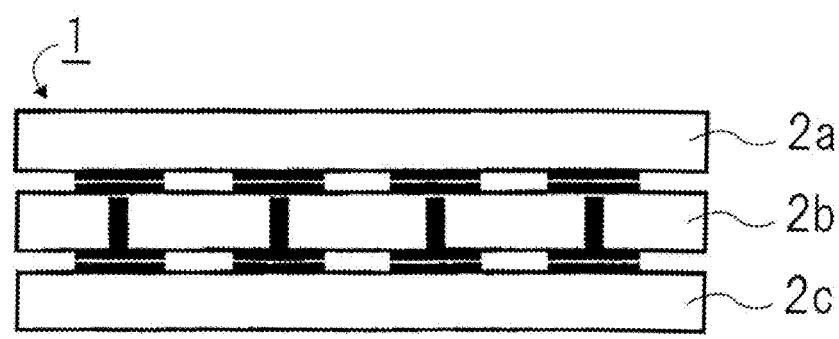
FIG. 3 is a schematic view illustrating a semiconductor device according to an exemplary embodiment of the present invention in which three semiconductor chips are stacked.

FIG. 3 illustrates semiconductor device 1 in which three semiconductor chips 2a, 2b and 2c are stacked. An electrode pad is formed on a surface of each semiconductor chip and these electrode pads are positioned opposite to each other at a certain distance, so that an inter-chip signal exchange is performed between the opposed electrode pads. In semiconductor chips 2a and 2c, an electrode pad is formed on a surface in which a circuit is formed, while in semiconductor chip 2b, an electrode pad is also formed on the rear surface thereof. This semiconductor chip 2b makes it possible to exchange a signal among semiconductor chips even if three or more semiconductor chips are stacked.

First Exemplary Embodiment of the Present Invention

Figure 4:
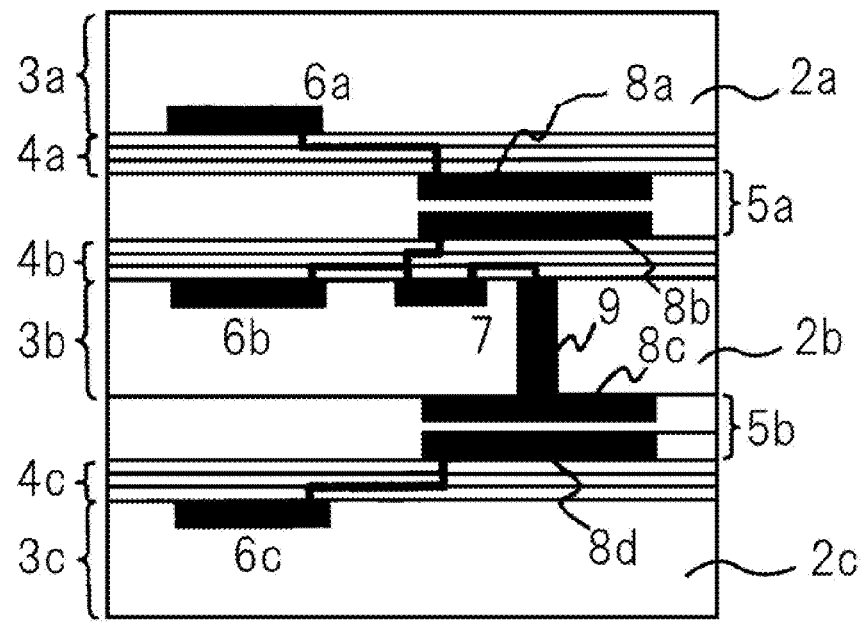
FIG. 4 is an enlarged view of an electrode pad portion in FIG. 3, illustrating the configuration of a first exemplary embodiment.

FIG. 4 is an enlarged view of an electrode pad portion in FIG. 3, and illustrates the configuration of a first exemplary embodiment. Semiconductor chip 2a is configured such that at least one transmitter/receiver circuit 6a is formed in silicon substrates 3a, and electrode pad 8a is formed in or on interconnection layers 4a formed on the transmitter/receiver circuit. Semiconductor chip 2c is configured such that at least one transmitter/receiver circuit 6c is formed in silicon substrates 3c, and electrode pad 8d is formed in or on interconnection layers 4c formed on the transmitter/receiver circuit. Semiconductor chip 2b is configured such that in addition to at least one transmitter/receiver circuit 6b, switch 7 is formed in silicon substrate 3b. In addition, electrode pad 8b is formed in or on interconnection layer 4b and electrode pad 8c is additionally formed on the rear surface of silicon substrate 3b through via hole 9 that penetrates silicon substrate 3b.

In semiconductor chip 2b, electrode pad 8b present on the circuit surface thereof is directly connected to transmitter/receiver circuit 6b, whereas electrode pad 8c present on the rear surface is connected to the transmitter/receiver circuit through via hole 9 and switch 7.

Operation of the present invention will be described with reference to FIG. 5.

Figure 5:
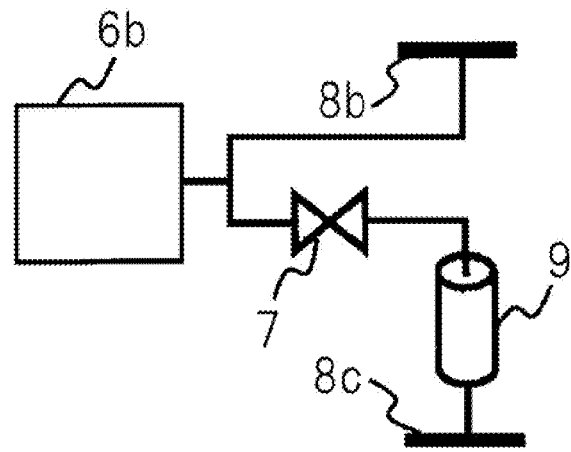
FIG. 5 is a circuit diagram of semiconductor chip 2b illustrated in FIG. 4.

FIG. 5 illustrates the circuit diagram of semiconductor chip 2b previously shown. When a signal is input from electrode pad 8b, switch 7 is opened. As a result, the signal that is input from electrode pad 8b is supplied to transmitter/receiver circuit 6b. On the other hand, when a signal from the transmitter/receiver circuit is input to electrode pad 8c, switch 7 is closed. Although each of transmitter/receiver circuits 6a, 6b and 6c is shown being integral as a transmitter/receiver circuit in the exemplary embodiment, the transmitter/receiver circuit may be a transmitter circuit and a receiver circuit that are separate from each other.

As can be seen from the circuit diagram of FIG. 5, via hole 9 is connected to electrode pad 8c. When a via hole is formed on a silicon substrate, a thin insulating layer must be provided on a boundary face between the silicon and the via hole, unlike when a via hole is formed on an organic substrate. Consequently, the parasitic capacitance of the via hole may amount to as large as several pF, which value is not negligible, as compared with capacitance formed between electrode pads of adjacent semiconductor chips. For this reason, in the present invention, switch 7 is provided in order to make the parasitic capacitance of this via hole 9 invisible from a signal that is input from electrode pad 8b.

On the other hand, when a signal is output from transmitter/receiver circuit 6b to electrode pad 8c, electrode pad 8b, as well as via hole 9 and electrode pad 8c, are visible from transmitter/receiver circuit 6b. However, the parasitic capacitance of electrode pad 8b is sufficiently small compared with that of via hole 9 and hence is negligible.

Interposing switch 7 not only between transmitter/receiver circuit 6b and electrode pad 8c but also between transmitter/receiver circuit 6b and electrode pad 8b is conceivable. In the present exemplary embodiment, in order to achieve low power consumption, a switch is provided only in a portion that connects to the via hole and that has the largest parasitic capacitance.

When a signal is input from electrode pad 8c, switch 7 is closed. As a result, the signal that is input from electrode pad 8c is supplied to transmitter/receiver circuit 6b. On the other hand, when a signal is output from the transmitter/receiver circuit to electrode pad 8b, switch 7 is opened.

Semiconductor chips 2a, 2b and 2c described above may be stacked as illustrated in FIG. 3 to form semiconductor device 1.

Second Exemplary Embodiment of the Present Invention

Figure 6:
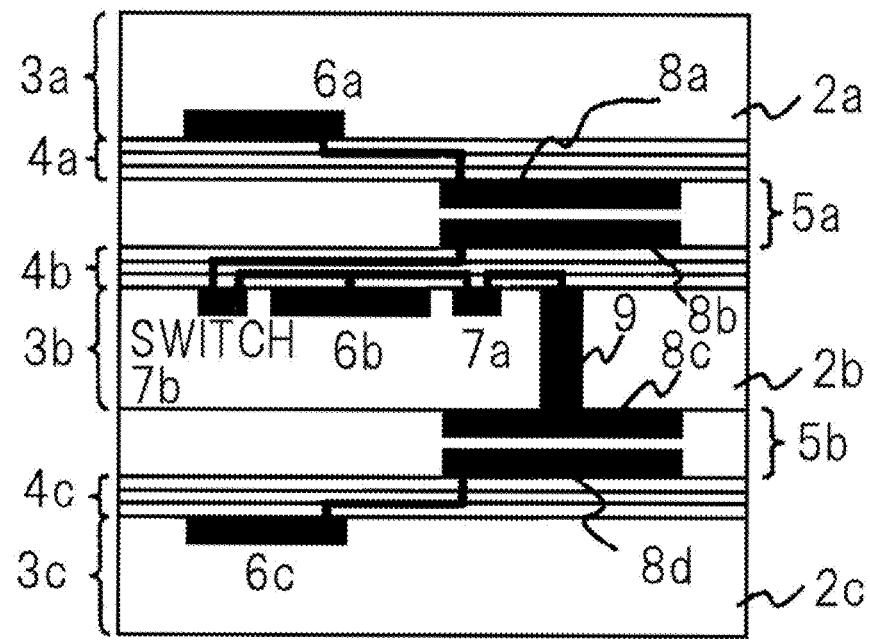
FIG. 6 is another enlarged view of the electrode pad portion in FIG. 3, illustrating the configuration of a second exemplary embodiment.

FIG. 6 illustrates a second exemplary embodiment.

In the first exemplary embodiment, switch 7 is provided between transmitter/receiver circuit 6b and via hole 9. In the present exemplary embodiment, however, switch 7b is additionally provided between transmitter/receiver circuit 6b and electrode pad 8b. Note that the switch provided between transmitter/receiver circuit 6b and via hole 9 is denoted as switch 7a. Both switches 7a and 7b are formed on the same silicon substrate as transmitter/receiver circuit 6b. The remainder of the second exemplary embodiment is the same as the first exemplary embodiment described earlier.

Figure 7:
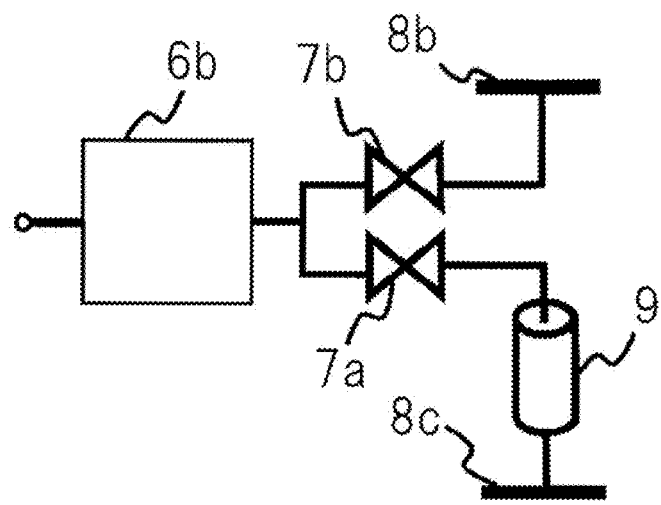
FIG. 7 is a circuit diagram of semiconductor chip 2b illustrated in FIG. 6.

Operation of the second exemplary embodiment will be described with reference to FIG. 7. When a signal is input from electrode pad 8b, switch 7b is closed and switch 7a is opened. As a result, via hole 9 having large parasitic capacitance is invisible from electrode pad 8b. On the other hand, when a signal is output from transmitter/receiver circuit 6b to electrode pad 8c, switch 7b is opened and switch 7a is closed. As a result, the parasitic capacitance of electrode pad 8b becomes invisible.

When a signal is input from electrode pad 8c, switch 7a is closed and switch 7b is opened. As a result, the parasitic capacitance of electrode pad 8b becomes invisible. On the other hand, when a signal is output from transmitter/receiver circuit 6b to electrode pad 8b, switch 7a is opened and switch 7b is closed. As a result, via hole 9 having large parasitic capacitance is invisible from electrode pad 8b.

When a signal is input from electrode pad 8c, the parasitic capacitance of electrode pad 8b, as well as the parasitic capacitance of via hole 9, is visible in the first exemplary embodiment. Accordingly, there is a possibility, particularly when chips are connected in a multistage manner beyond electrode pad 8b, that this parasitic capacitance becomes larger, degrading signal quality. In the present exemplary embodiment, however, switch 7b has the capability to eliminate the parasitic capacitance of electrode pad 8b, thus improving the signal quality.

Semiconductor chips 2a, 2b and 2c described above may be stacked as illustrated in FIG. 3 to form semiconductor device 1.

Third Exemplary Embodiment of the Present Invention

Figure 8:
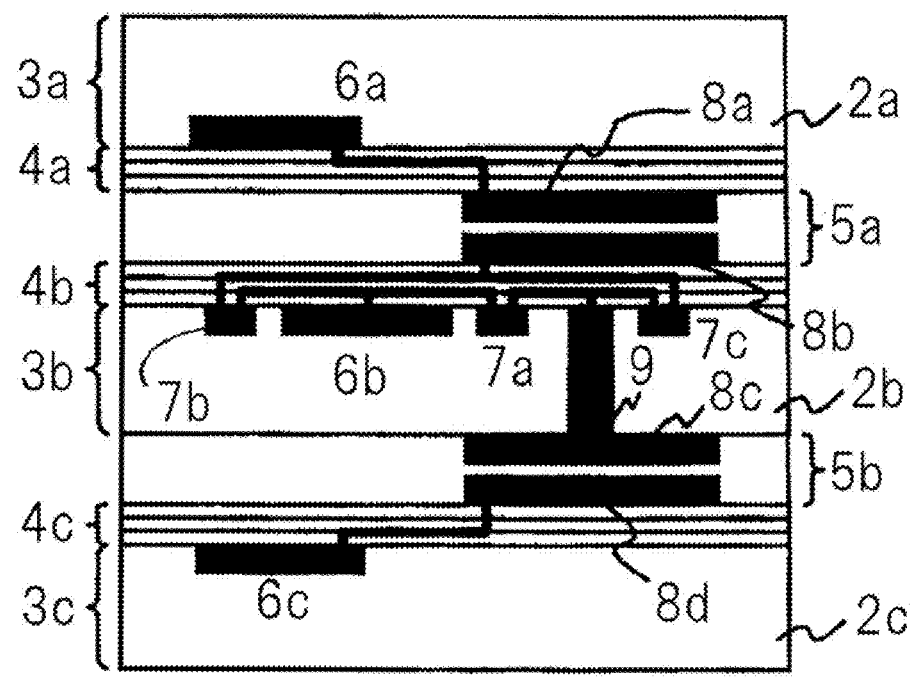
FIG. 8 is another enlarged view of the electrode pad portion in FIG. 3, illustrating the configuration of a third exemplary embodiment.

FIG. 8 illustrates a third exemplary embodiment.

In the second exemplary embodiment, switch 7a is provided between transmitter/receiver circuit 6b and via hole 9 and switch 7b is additionally provided between transmitter/receiver circuit 6b and electrode pad 8b. In the present exemplary embodiment, however, there is provided switch 7c for directly opening/closing a path between upper and lower electrode pads 8b and 8c. All of switches 7a, 7b and 7c are formed on the same silicon substrate as transmitter/receiver circuit 6b. The remainder of the third exemplary embodiment is the same as the second exemplary embodiment described earlier.

Figure 9:
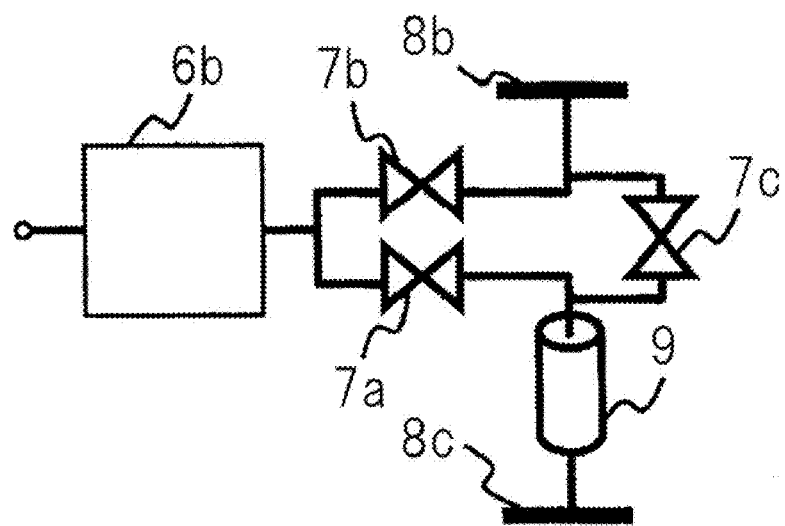
FIG. 9 is a circuit diagram of semiconductor chip 2b illustrated in FIG. 8.

FIG. 9 illustrates the circuit diagram shown in FIG. 8.

A signal exchange between electrode pad 8b and transmitter/receiver circuit 6b and a signal change between electrode pad 8c and transmitter/receiver circuit 6b are performed in the same manner as in the second exemplary embodiment. When a signal is directly transmitted between electrode pad 8b and electrode pad 8c, switch 7c is closed and switches 7a and 7b are opened. In this case, transmitter/receiver circuit 6b is not visible as a load.

The same signal transmission as described above is possible in the first and second exemplary embodiments. In that case, since the transmitter/receiver circuit is visible as a load, signal attenuation becomes accordingly large.

In the present exemplary embodiment, particularly when a signal needs to be directly transmitted from semiconductor chip 2a to semiconductor chip 2c or from semiconductor chip 2c to semiconductor chip 2a, the signal does not pass through two switches 7a and 7b, but is allowed to pass through only one switch 7c. Therefore, signal attenuation becomes smaller.

Semiconductor chips 2a, 2b and 2c described above may be stacked as illustrated in FIG. 3 to form semiconductor device 1.

Fourth Exemplary Embodiment of the Present Invention

Figure 10:
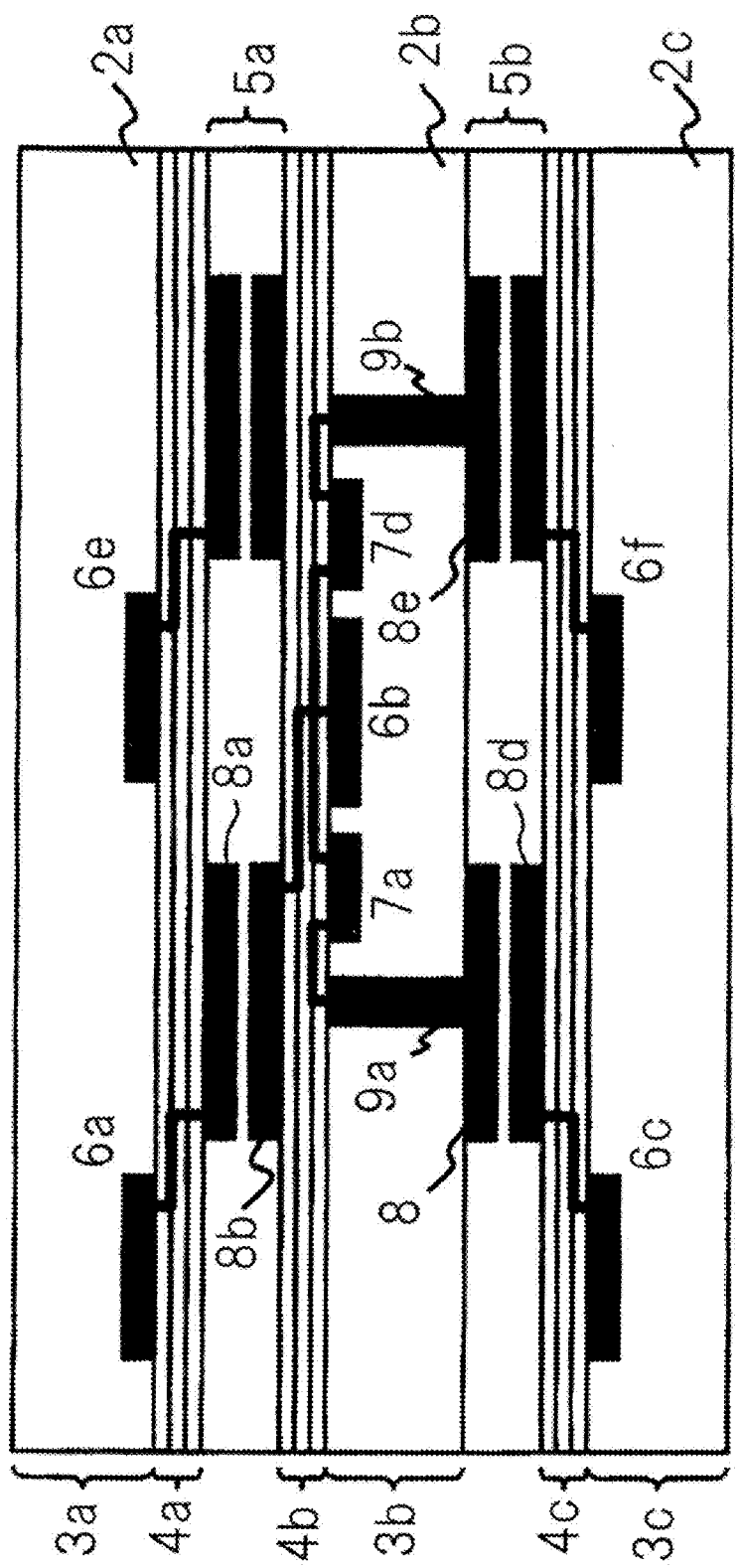
FIG. 10 is another enlarged view of the electrode pad portion in FIG. 3, illustrating the configuration of a fourth exemplary embodiment.

FIG. 10 illustrates a fourth exemplary embodiment.

Semiconductor chip 2a is configured such that at least one transmitter/receiver circuit 6a is formed in silicon substrate 3a, and electrode pad 8a is formed in or on interconnection layers 4a formed on the transmitter/receiver circuit. Semiconductor chip 2c is configured such that at least one transmitter/receiver circuit 6c is formed in silicon substrate 3c, and electrode pad 8d is formed in or on interconnection layers 4c formed on the transmitter/receiver circuit. Semiconductor chip 2b is configured such that in addition to at least one transmitter/receiver circuit 6b, switches 7a and 7d are formed in silicon substrate 3b. Electrode pad 8b is formed in or on interconnection layer 4b, and electrode pad 8c is additionally formed on the rear surface of silicon substrate 3b through via hole 9a that penetrates silicon substrate 3b. Electrode pad 8e is additionally formed on the rear surface of silicon substrate 3b through via hole 9b that penetrates silicon substrate 3b.

In semiconductor chip 2b, electrode pad 8b that is present on the circuit surface thereof is directly connected to transmitter/receiver circuit 6b, but electrode pad 8c that is present on the rear surface is connected to transmitter/receiver circuit 6b through via hole 9a and switch 7a, and electrode pad 8e that is present on the rear surface is connected to transmitter/receiver circuit 6b through via hole 9b and switch 7d.

Two switches 7a and 7d have the function of cutting off the interconnection so that the parasitic capacitances of via hole 9a and 9b are invisible from transmitter/receiver circuit 6b and also have the function of selecting electrode pad 8c or electrode pad 8e.

Figure 11:
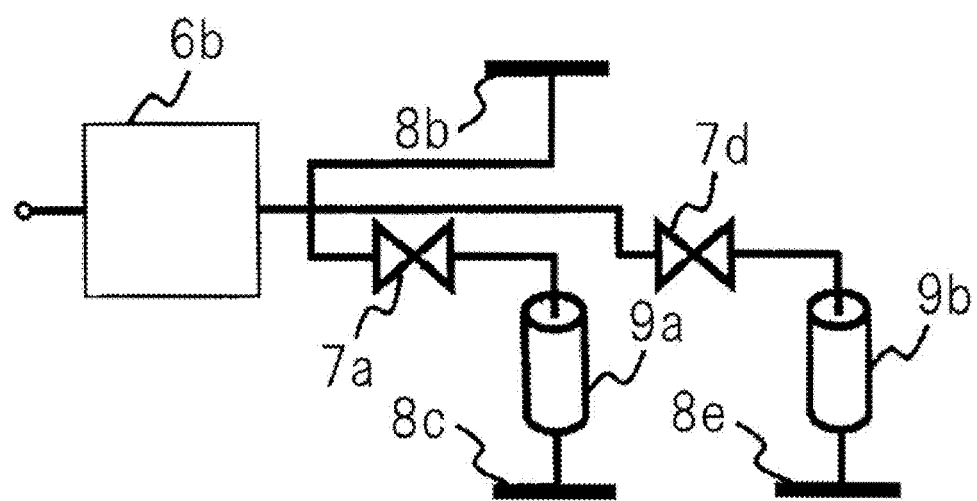
FIG. 11 is a circuit diagram of semiconductor chip 2b illustrated in FIG. 10.

FIG. 11 is the circuit diagram shown in FIG. 10.

When switch 7a is closed and switch 7d is opened, a signal exchange between electrode pad 8b and transmitter/receiver circuit 6b and a signal change between electrode pad 8c and transmitter/receiver circuit 6b are performed in the same manner as in the first exemplary embodiment.

When switch 7a is opened and switch 7d is closed, a signal exchange between electrode pad 8b and transmitter/receiver circuit 6b and a signal exchange between electrode pad 8e and transmitter/receiver circuit 6b are performed in the same manner as in the first exemplary embodiment.

In the present exemplary embodiment, the data processing rate is increased by forming a one-to-many connection between the upper and lower chips. In addition, by providing switches 7a and 7d, loads on electrodes 8c and 8e can be isolated, thus maintaining high signal quality.

Semiconductor chips 2a, 2b and 2c described above may be stacked as illustrated in FIG. 3 to form semiconductor device 1. This semiconductor device is a semiconductor device wherein a one-to-many connection is formed between the upper and lower chips, and provides the above-described advantages.

Fifth Exemplary Embodiment of the Present Invention

Figure 12:
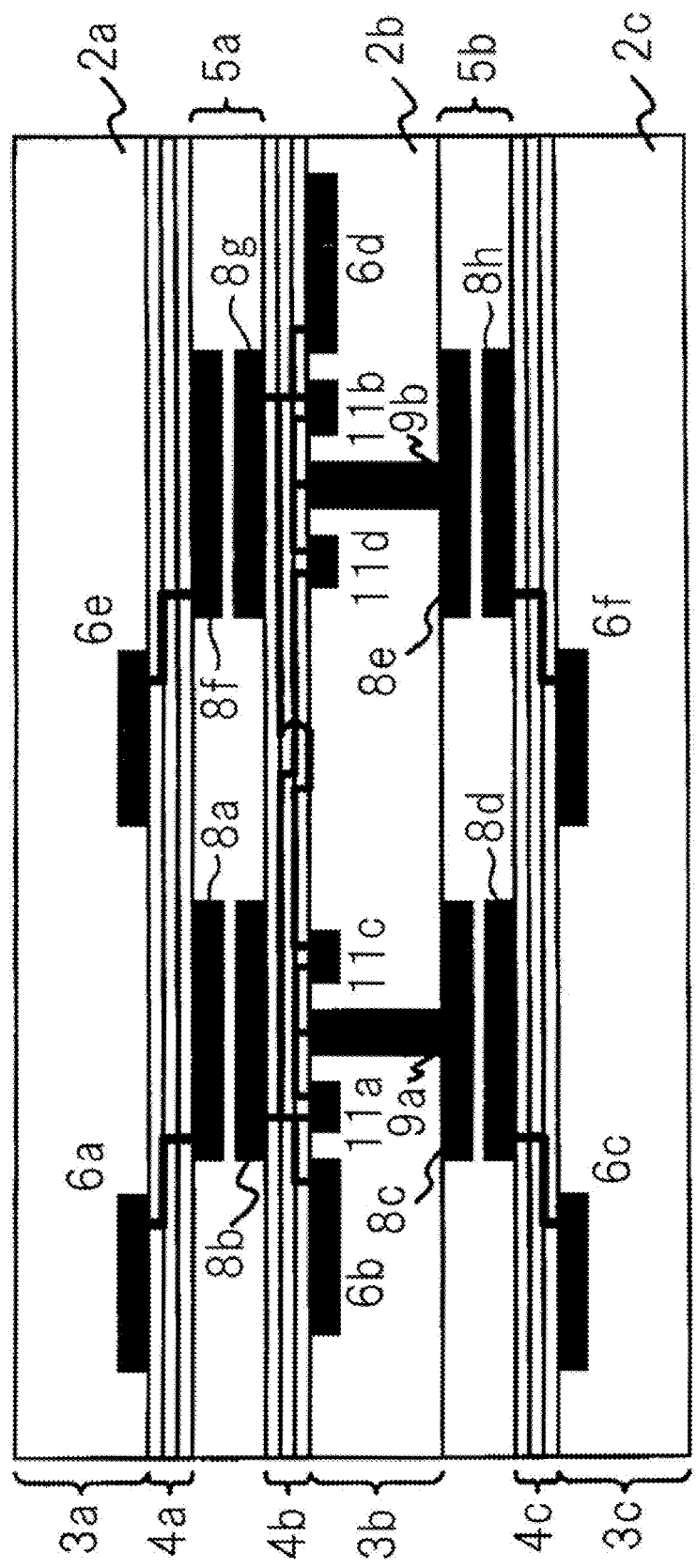
FIG. 12 is another enlarged view of the electrode pad portion in FIG. 3, illustrating the configuration of a fifth exemplary embodiment.

FIG. 12 illustrates a fifth exemplary embodiment.

Semiconductor chip 2a is configured such that at least one transmitter/receiver circuit 6a is formed in silicon substrate 3a, and electrode pad 8a is formed in or on interconnection layer 4a formed on the transmitter/receiver circuit. Semiconductor chip 2c is configured such that at least one transmitter/receiver circuit 6c is formed in silicon substrate 3c, and electrode pad 8d is formed in or on interconnection layer 4c formed on the transmitter/receiver circuit. Semiconductor chip 2b is configured such that in addition to at least one transmitter/receiver circuit 6b, switches 11a and 11d are formed in silicon substrate 3b. Furthermore, electrode pad 8b is formed in or on interconnection layer 4b, and electrode pad 8c is additionally formed on the rear surface of silicon substrate 3b through via hole 9a that penetrates silicon substrate 3b. Still furthermore, electrode pad 8e is additionally formed on the rear surface of silicon substrate 3b through via hole 9b that penetrates silicon substrate 3b.

In semiconductor chip 2b, electrode pad 8b that is present on the circuit surface thereof is directly connected to transmitter/receiver circuit 6b, but electrode pad 8c that is present on the rear surface is connected to transmitter/receiver circuit 6b through via hole 9a and switch 11a. In addition, electrode pad 8e that is present on the rear surface is connected to transmitter/receiver circuit 6b through via hole 9b and switch 11d.

Two switches 11a and 11d have the function of cutting off the interconnection so that the parasitic capacitances of via hole 9a and 9b are invisible from transmitter/receiver circuit 6b and also have the function of selecting electrode pad 8c or electrode pad 8e.

In addition, semiconductor chip 2a is configured such that at least one transmitter/receiver circuit 6e is formed in silicon substrate 3a, and electrode pad 8f is formed in or on interconnection layer 4a formed on the transmitter/receiver circuit. Semiconductor chip 2c is configured such that at least one transmitter/receiver circuit 6f is formed in silicon substrate 3c, and electrode pad 8h is formed in or on interconnection layer 4c formed on the transmitter/receiver circuit. Semiconductor chip 2b is configured such that in addition to at least one transmitter/receiver circuit 6d, switches 11b and 11c are formed in silicon substrate 3b. Furthermore, electrode pad 8g is formed in or on interconnection layer 4b.

In semiconductor chip 2b, electrode pad 8g that is present on the circuit surface thereof is directly connected to transmitter/receiver circuit 6d, but electrode pad 8e that is present on the rear surface is connected to transmitter/receiver circuit 6d through via hole 9b and switch 11b. In addition, electrode pad 8c that is present on the rear surface is connected to transmitter/receiver circuit 6d through via hole 9a and switch 11c.

Two switches 11b and 11c have the function of cutting off the interconnection so that the parasitic capacitances of via hole 9a and 9b are invisible from transmitter/receiver circuit 6d and also have the function of selecting electrode pad 8c or electrode pad 8e.

That is, formed on semiconductor chip 2b are two transmitter/receiver circuits 6b and 6d and four switches 11a, 11b, 11c and 11d. Thus, it is possible to select one electrode from upper, lower, left and right electrode pads 8b, 8c, 8g and 8e.

Figure 13:
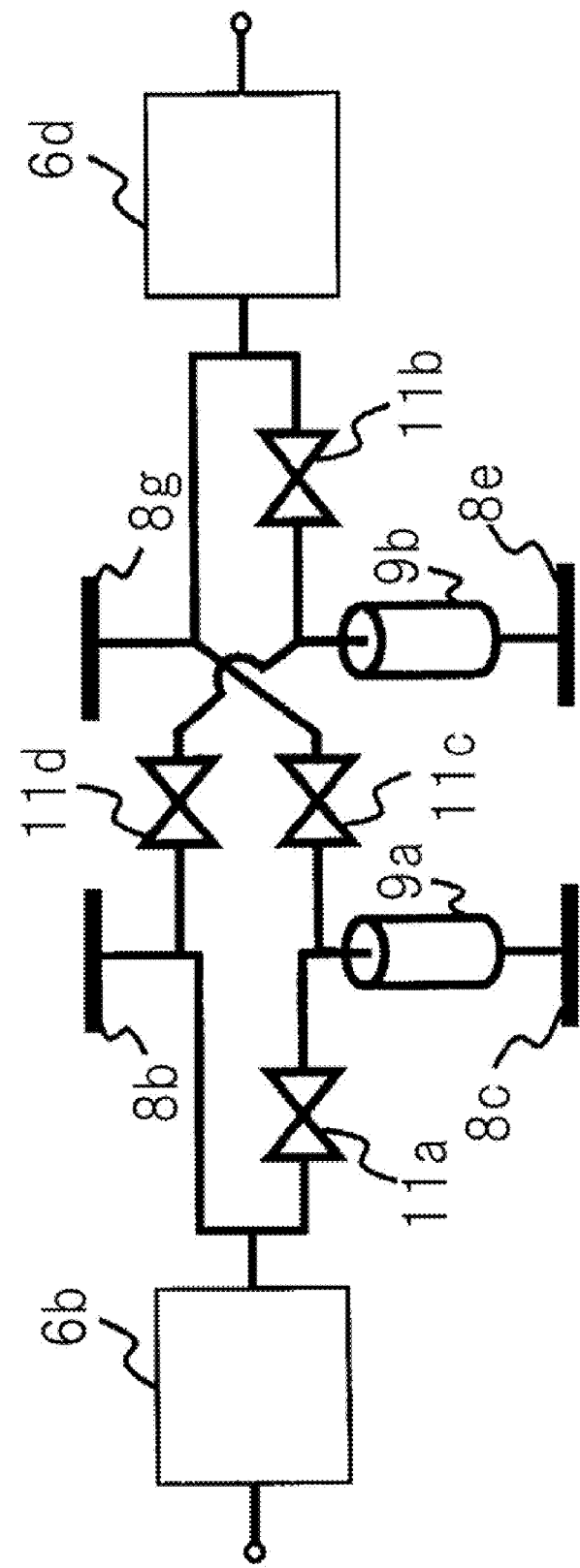
FIG. 13 is a circuit diagram of semiconductor chip 2b illustrated in FIG. 12.

FIG. 13 illustrates the circuit diagram shown in FIG. 12.

When switch 11a is closed and switch 11d is opened, a signal exchange between electrode pad 8b and transmitter/receiver circuit 6b and a signal change between electrode pad 8c and transmitter/receiver circuit 6b are performed in the same manner as in the first exemplary embodiment.

When switch 11a is opened and switch 11d is closed, a signal exchange between electrode pad 8b and transmitter/receiver circuit 6b and a signal exchange between electrode pad 8e and transmitter/receiver circuit 6b are performed in the same manner as in the first exemplary embodiment.

When switch 11b is closed and switch 11c is opened, a signal exchange between electrode pad 8g and transmitter/receiver circuit 6d and a signal exchange between electrode pad 8e and transmitter/receiver circuit 6d are performed in the same manner as in the first exemplary embodiment.

When switch 11b is opened and switch 11c is closed, a signal exchange between electrode pad 8g and transmitter/receiver circuit 6d and a signal exchange between electrode pad 8c and transmitter/receiver circuit 6d are performed in the same manner as in the first exemplary embodiment.

In the present exemplary embodiment, the data processing rate is increased higher than in the fourth exemplary embodiment by forming a many-to-many connection between the upper and lower chips. In addition, loads on electrodes 8c and 8e can be isolated by the switches, thus maintaining high signal quality.

Semiconductor chips 2a, 2b and 2c described above may be stacked as illustrated in FIG. 3 to form semiconductor device 1. This semiconductor device is a semiconductor device wherein a one-to-many connection is formed between the upper and lower chips form, and provides the above-described advantages.

Sixth Exemplary Embodiment of the Present Embodiment

Figure 14:
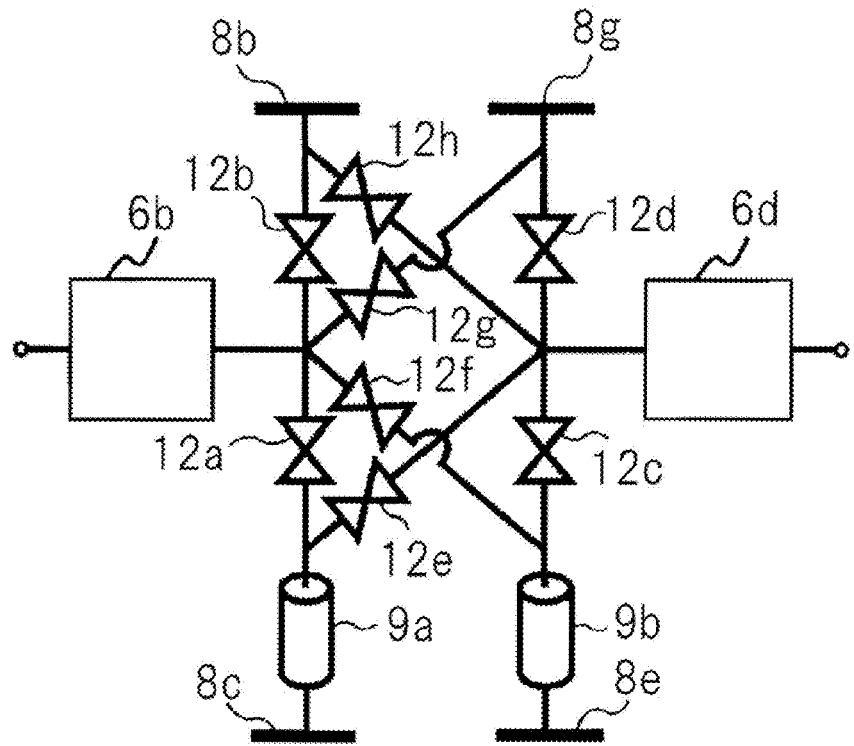
FIG. 14 is a circuit diagram of semiconductor chip 2b of a sixth exemplary embodiment.

FIG. 14 illustrates a circuit diagram of a sixth exemplary embodiment. The sixth exemplary embodiment is a combination of the third exemplary embodiment and the fifth exemplary embodiment.

Switch 12b is provided between transmitter/receiver circuit 6b and electrode pad 8b and switch 12g is provided between transmitter/receiver circuit 6b and electrode pad 8g. In addition, switch 12h is provided between transmitter/receiver circuit 6d and electrode pad 8b and switch 12d is provided between transmitter/receiver circuit 6d and electrode pad 8g.

Semiconductor chip 2b is configured such that in addition to at least one transmitter/receiver circuit 6b, switches 12a and 12f are formed in silicon substrate 3b. Furthermore, electrode pad 8b is formed in or on interconnection layer 4b, and electrode pad 8c is additionally formed on the rear surface of silicon substrate 3b through via hole 9a that penetrates silicon substrate 3b. Still furthermore, electrode pad 8e is additionally formed on the rear surface of silicon substrate 3b through via hole 9b that penetrates silicon substrate 3b.

Electrode pad 8c is connected to transmitter/receiver circuit 6b through via hole 9a and switch 12a. In addition, electrode pad 8e is connected to transmitter/receiver circuit 6b through via hole 9b and switch 12f.

Two switches 12a and 12f have the function of cutting off the interconnection so that the parasitic capacitances of via hole 9a and 9b are invisible from transmitter/receiver circuit 6b and also have the function of selecting electrode pad 8c or electrode pad 8e.

In addition, semiconductor chip 2b is configured such that in addition to at least one transmitter/receiver circuit 6d, switches 12c and 12e are formed on silicon substrate 3b. Furthermore, electrode pad 8g is formed in or on interconnection layer 4b.

Electrode pad 8e is connected to transmitter/receiver circuit 6d through via hole 9b and switch 12c. In addition, electrode pad 8c is connected to transmitter/receiver circuit 6d through via hole 9a and switch 12e.

Two switches 12c and 12e have the function of cutting off the interconnection so that the parasitic capacitances of via hole 9a and 9b are invisible from transmitter/receiver circuit 6d and also have the function of selecting electrode pad 8c or electrode pad 8e.

In the present exemplary embodiment, there are provided switches 12h and 12e for directly opening/closing a path between upper and lower electrode pads 8b and 8c and switches 12g and 12f for directly opening/closing a path between upper and lower electrode pads 8g and 8e.

That is, formed on semiconductor chip 2b are two transmitter/receiver circuits 6b and 6d and eight switches 12a, 12b, 12c, 12d, 12e, 12f, 12g and 12h that form a crossbar switch. Thus, it is possible to select one electrode from upper, lower, left and right electrode pads 8b, 8c, 8d and 8e.

When switches 12a, 12b, 12e and 12h are closed and switches 12c, 12d, 12f and 12g are opened, a signal exchange between electrode pad 8b and transmitter/receiver circuit 6b and a signal exchange between electrode pad 8c and transmitter/receiver circuit 6b are performed in the same manner as in the third exemplary embodiment.

When switches 12a, 12b, 12e and 12h are opened and switches 12c, 12d, 12f and 12g are closed, a signal exchange between electrode pad 8g and transmitter/receiver circuit 6d and a signal exchange between electrode pad 8e and transmitter/receiver circuit 6d are performed in the same manner as in the third exemplary embodiment.

When switches 12a, 12c, 12e and 12f are closed and switches 12b, 12d, 12g and 12h are opened, a signal exchange between electrode pad 8b and transmitter/receiver circuit 6b, a signal exchange between electrode pad 8c and transmitter/receiver circuit 6b, a signal exchange between electrode pad 8g and transmitter/receiver circuit 6d and a signal exchange between electrode pad 8e and transmitter/receiver circuit 6d are performed in the same manner as in the fifth exemplary embodiment.

In the present exemplary embodiment, the data processing rate is increased higher than in the fifth exemplary embodiment by connecting between the upper and lower chips by means of crossbar switches. In addition, loads on a plurality of electrodes can be isolated by the switches, thus maintaining high signal quality.

Since the crossbar switch configuration allows a required contact point to be selected and then opened or closed, problems such as inter-chip data collision or crosstalk are less likely to occur and transmission speed can be easily increased. These effects are significant particularly when a plurality of microcontrollers are connected to one another in the CPU-to-CPU connection.

Semiconductor chips 2a, 2b and 2c described above may be stacked as illustrated in FIG. 1 to form semiconductor device 1. This semiconductor device is a semiconductor device wherein the upper and lower chips are connected by crossbar switches, and provides the above-described advantages.

Seventh Exemplary Embodiment of the Present Invention

Figure 15:
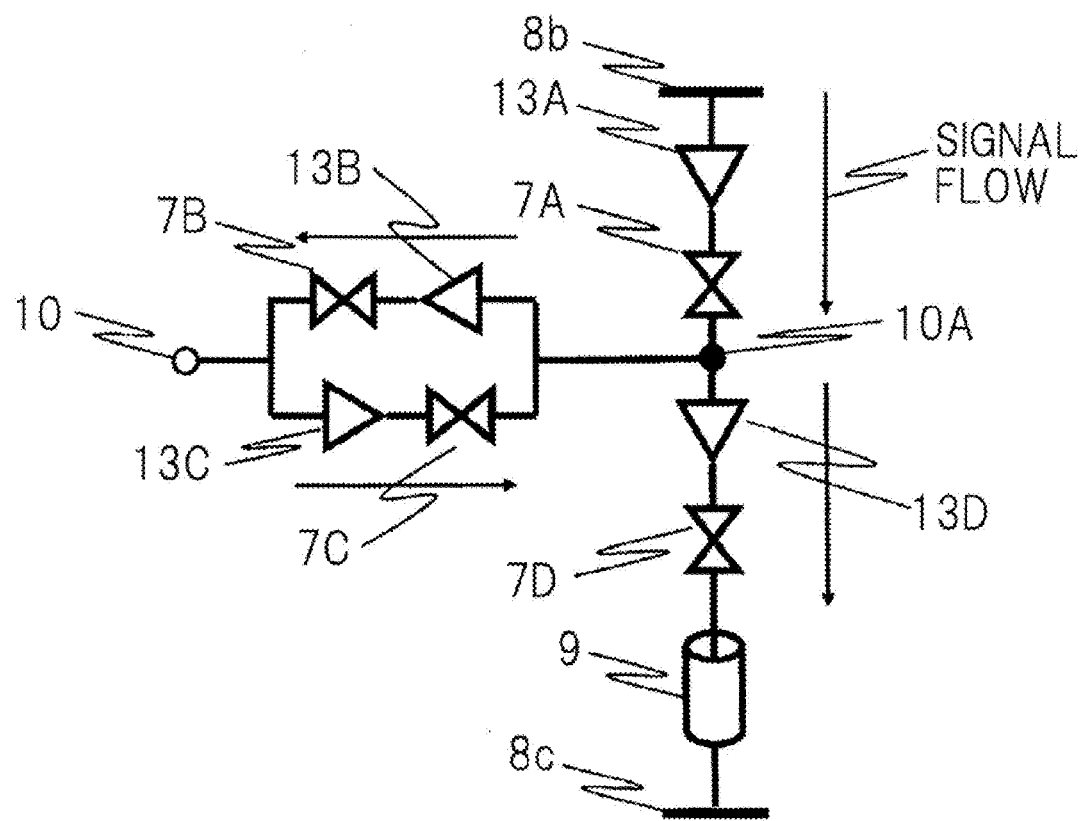
FIG. 15 is a schematic view to explain the operation of one-way communication in which the flow of data transmission is in a direction from an upper electrode to a lower electrode and a capacitive-coupling portion includes an amplifier element.

When a plurality of chips are stacked and inter-chip data is transmitted and received through capacitive coupling, the following problems occur: 1) a signal to be transmitted/received has a differential waveform; 2) when a signal passes through a through-via hole, the signal is affected by the parasitic capacitance at the through-via hole and the strength of a received signal decreases; and 3) since a signal is transmitted through switches 12a to 12h shown in, for example, the sixth exemplary embodiment, the strength of the received signal is decreased by the resistances of switches 12a to 12h. A description will now be made of a method to solve these problems by using amplifier elements in data transmission/reception through capacitive coupling, with reference to FIG. 15. FIG. 15 illustrates one-way communication in which data transmission is performed in a direction from an upper electrode to a lower electrode.

First, when data is transmitted from upper electrode 8b to terminal 10 for transmitter/receiver circuit 6b or the like, switches 7A and 7B are turned on and switches 7C and 7D are turned off. As a result, data that is input from upper electrode 8b is received and amplified by amplifier 13A, passes through switch 7A and contact point 10A and is received and amplified by amplifier 13B. Data that is amplified by amplifier 13B is input to an internal circuit through switch 7B. At this time, amplifiers 13C and 13D receive and amplify similar data. However, since switches 7C and 7D are turned off, contention does not take place between data from amplifier 13A and data from amplifier 13C at contact point 10A, and data transmission to lower electrode 8c by way of through-via hole 9 also does not take place. As a result, a desired data transmission is performed without causing any false operation. Furthermore, by performing data transmission through amplifiers, it is possible to accurately receive a signal that is attenuated by capacitive coupling and the resistance of switch 7A. In addition, when there are no amplifiers, transmission power needs to be increased in order to maintain the strength of a received signal to be greater than the sensitivity of a receiver circuit, but by performing data transmission through amplifiers, transmission power can be reduced.

Next, when data from the internal circuit is transferred to lower electrode 8c, switches 7C and 7D are turned on and switches 7A and 7B are turned off. As a result, the data from the internal circuit is received and amplified by amplifier 13C, passes through switch 7C and contact point 10A, and is then transmitted to amplifier 13D. The transmitted data is received and amplified by amplifier 13D, and output to lower electrode 8c through switch 7D and through-via hole 9. At this time, since amplifier 13B is connected to contact point 10A, amplifier 13B receives and amplifies similar data. However, since switch 7B is turned off, there is no occurrence of data contention at terminal 10 that is connected to the internal circuit and no false operation is caused. In addition, although data that is input to upper electrode 8b is received and amplified by amplifier 13A, there is no occurrence of data contention at contact point 10A and no operation is caused because switch 7A is turned off. As a result, a desired data transmission is performed in a direction from the internal circuit toward lower electrode 8c. Furthermore, since the signal is amplified by amplifier 13D, it is possible to convey the signal received at upper electrode 8b to lower electrode 8c with the signal being amplified. Consequently, it is possible to transmit a signal to a lower chip with the signal being fully amplified, although the signal transmission is executed by means of capacitive coupling. When three or more chips are stacked, if there are no amplifiers, the transmission amplitude needs to be increased so that three or more chips can perform transmission. When data transmission is performed through amplifiers, however, the transmission amplitude may only be as large as is required for one chip, since a signal is amplified for transmission from each one chip to another. In addition, when there are no amplifiers, only the chips, the number of which is the number of chips that is determined at the time of design, can be stacked. When data transmission is performed through amplifiers, however, the number of chips to be stacked needs not be considered at the time of design.

When data from an upper electrode is transmitted to both the internal circuit and lower electrode 8c, switches 7A, 7B and 7D are turned on and switch 7C is turned off. As a result, the data from upper electrode 8b is transmitted to the internal circuit through amplifier 13A, switch 7A, amplifier 13B and switch 7B and, at the same time, is also transmitted to lower electrode 8c through amplifier 13A, switch 7A, amplifier 13D and switch 7D. At this time, amplifier 13C receives and amplifies similar data. However, since switch 7C is turned off, no conflict occurs at contact point 10A between the data from the upper electrode and the data from the internal circuit. Thus, the chips can operate normally.

Figure 16:
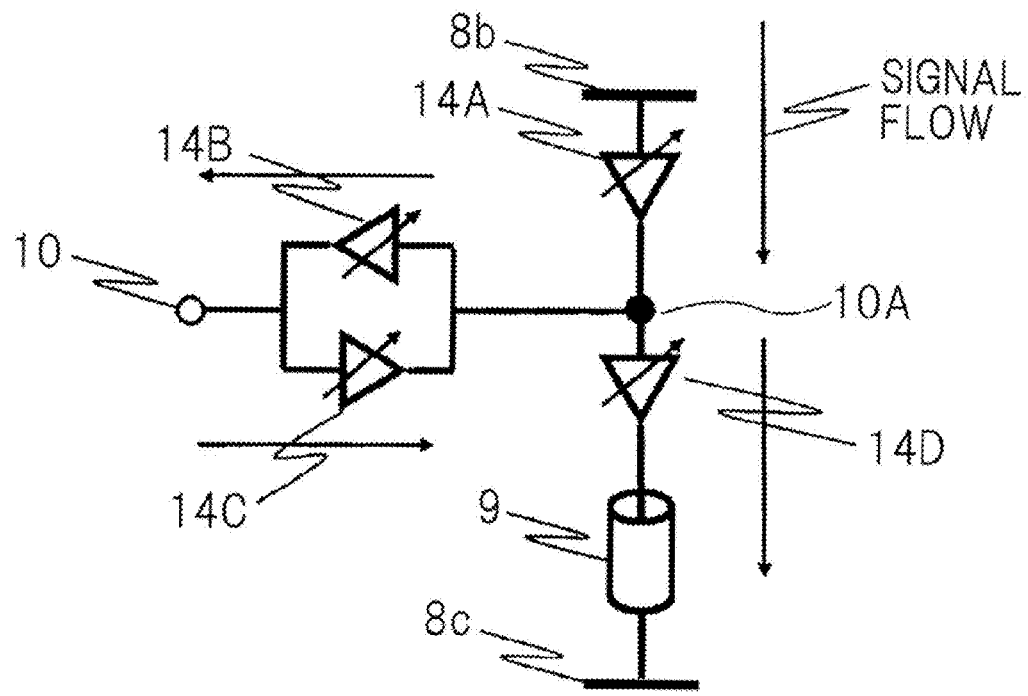
FIG. 16 is a schematic view to explain the operation of one-way communication in which the flow of data transmission is in a direction from an upper electrode to a lower electrode and a capacitive-coupling portion includes an amplifier fitted with a switch function.

An explanation will now be made of the operation of one-way communication in which data transmission is performed in a direction from an upper electrode to a lower electrode and a capacitive-coupling portion includes amplifiers with a switch function, with reference to FIG. 16.

When a capacitive-coupling portion includes amplifier elements, as described in FIG. 15, data transmission from upper electrode 8b to lower electrode 8c can also be achieved even when using amplifiers that have a switch function.

When data is transmitted from upper electrode 8b to the internal circuit, for example, it is possible to perform the data transmission normally, while avoiding data contention, by turning on amplifiers 14A and 14B with a switch and turning off amplifiers 14C and 14D with a switch in the same way as in FIG. 15. Data transmission from the internal circuit to lower electrode 8c and data transmission from upper electrode 8b to both the internal circuit and lower electrode 8c can be performed normally, while avoiding data contention in the same manner as in FIG. 15.

By connecting an amplifier in series with a switch or by using an amplifier with a switch, a reduction in amplitude due to the resistance of a switch can be improved thereby enhancing signal quality.

Eighth Exemplary Embodiment of the Present Invention

Figure 17:
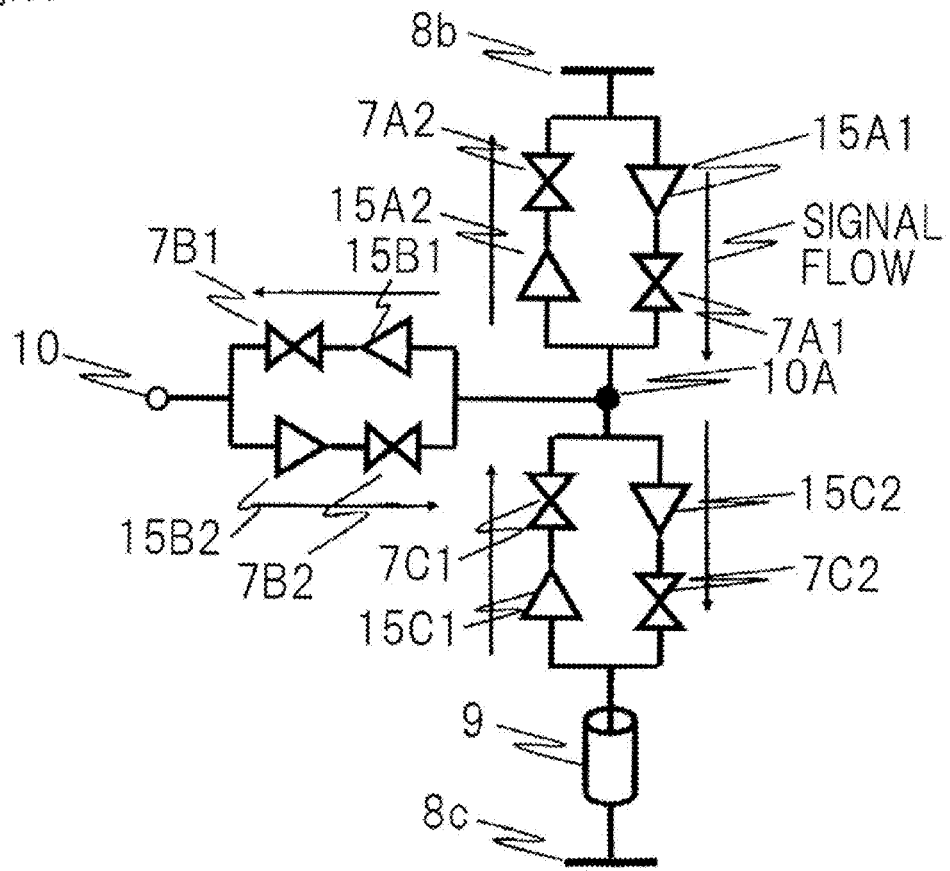
FIG. 17 is a schematic view to explain the operation of two-way communication in which the flow of data transmission is in a direction from an upper electrode to a lower electrode and from the lower electrode to the upper electrode and a capacitive-coupling portion includes an amplifier element.

An explanation will now be made of operation in a case in which a flow of data is both in a direction from an upper electrode to a lower electrode and in a direction from a lower electrode to an upper electrode, and a capacitive-coupling portion includes amplifiers that have a switch function, with reference to FIG. 17.

When data is transmitted from upper electrode 8b to an internal circuit, switches 7A1 and 7B1 are turned on, and switches 7A2, 7B2, 7C1 and 7C2 are turned off. As a result, data that is input to upper electrode 8b is received and amplified by amplifier 15A1, passes through switch 7A1 and is received and amplified by amplifier 15B1. The data that is amplified by amplifier 15B1 passes through switch 7A1, and is transmitted to the internal circuit through switch 7B1. At this time, since switches 7A2, 7B2, 7C1 and 7C2 are turned off, there is no data contention at contact point 10A. Thus, the data can be transmitted normally. On the other hand, when data is transmitted from the internal circuit to upper electrode 8b, data transmission can be performed, without causing any data contention, by turning on switches 7B2 and 7A2 and turning off switches 7A1, 7B1, 7C1 and 7C2. Similarly, when data is transmitted from upper electrode 8b to lower electrode 8c or from lower electrode 8c to upper electrode 8b, data transmission can be performed, as in the case of transmitting data from upper electrode 8b to lower electrode 8c, by correctly selecting switches to be turned on and to be turned off. In addition, it is also possible to simultaneously transmit data from one electrode toward two electrodes, as in the case of transmission from upper electrode 8b to both the internal circuit and lower electrode 8c.

Ninth Exemplary Embodiment of the Present Invention

Figure 18:
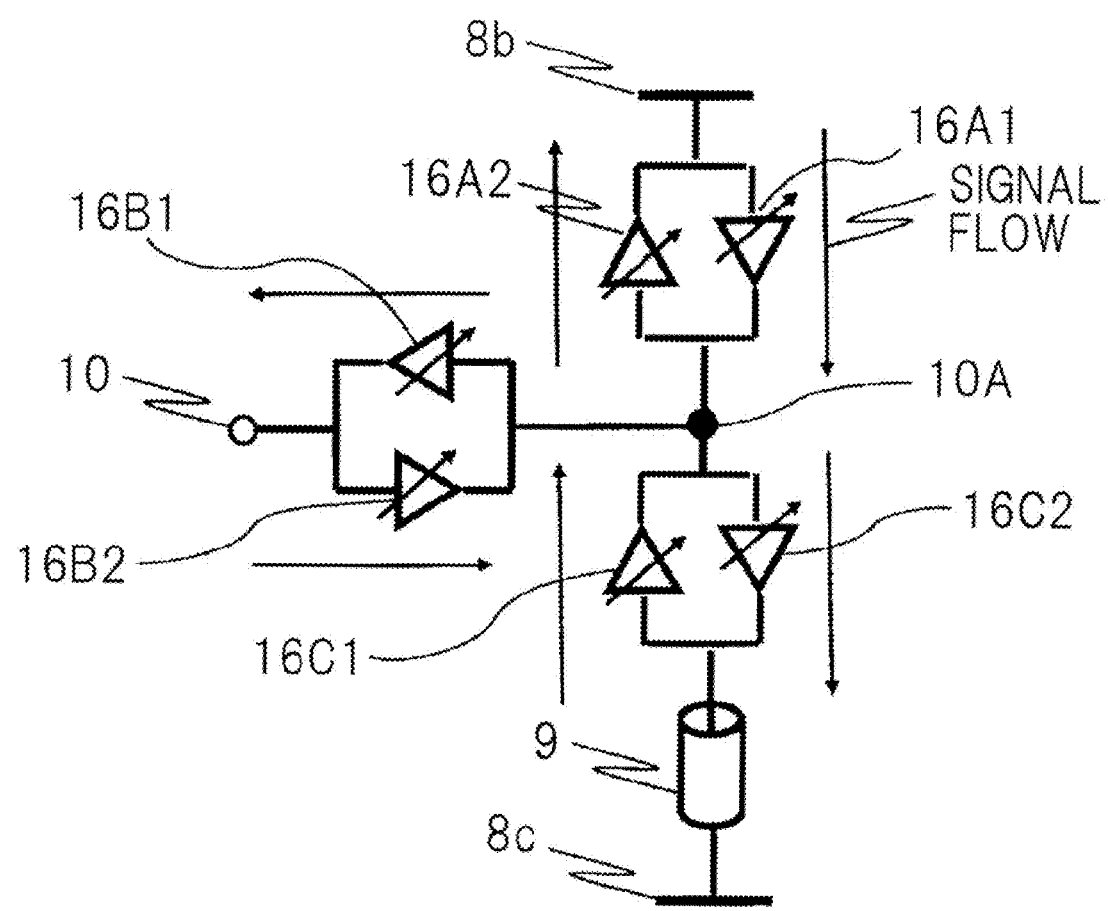
FIG. 18 is a schematic view to explain the operation of two-way communication in which the flow of data transmission is in a direction from an upper electrode to a lower electrode and from the lower electrode to the upper electrode and a capacitive-coupling portion includes an amplifier having a switch function.

FIG. 18 illustrates a ninth exemplary embodiment. In the present exemplary embodiment, amplifier elements that have a switch are used in place of the amplifiers and switch elements that are separately arranged in the eighth exemplary embodiment. Since amplifier elements fitted with a switch are used in place of amplifiers and switches, the present exemplary embodiment is the same in operation as the eighth exemplary embodiment, but has advantages such as areal reductions and reductions in power consumption.

Examples of Transmitter/Receiver Circuit of First Exemplary Embodiment

Figure 19:
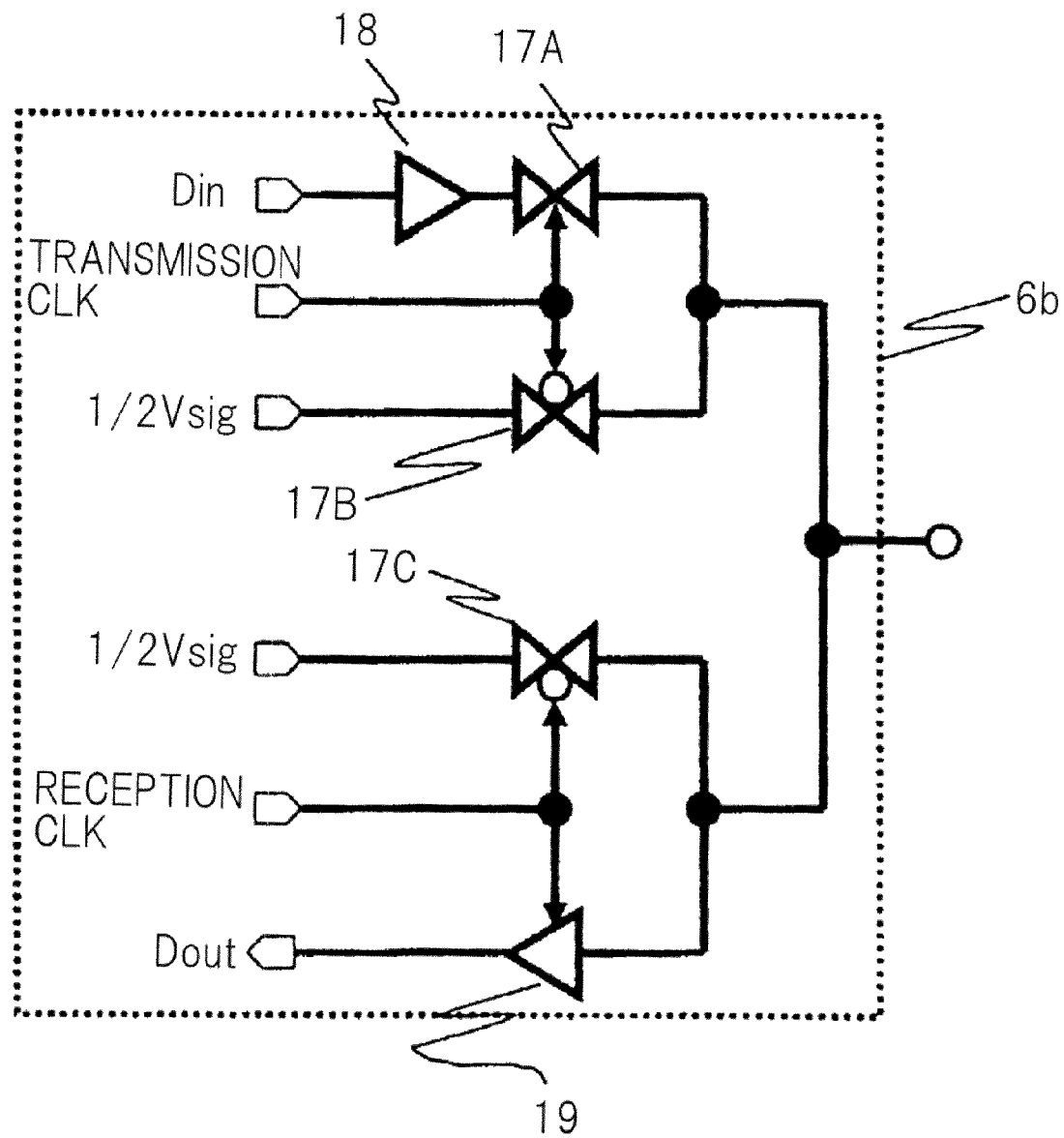
FIG. 19 is a diagram of a transmitter/receiver circuit of the first exemplary embodiment.

Examples of a transmitter/receiver circuit of the first exemplary embodiment will be described using the transmitter/receiver circuit diagram of FIG. 19 and the timing chart of FIG. 20.

Transmission data is a non-return-to-zero (NRZ) signal which is transmitted in synchronization with the rising timing of a clock signal and is input from terminal Din to transmission buffer 18. The level of a signal to be conveyed to lower electrode 8c by way of through-via hole 9 is determined to be either the voltage of data or half the voltage of data, according to transmission clock CLK. That is, the transmission data of a transmission buffer output is conveyed to lower electrode 8c within a high-level period of transmission clock CLK, and a voltage level half the voltage of the transmission data is conveyed to lower electrode 8c within a low-level period of transmission clock CLK. Only the information on transition of the data at lower electrode 8c is conveyed to upper electrode 8d coupled with lower electrode 8c through capacitive coupling, due to the capacitive coupling. For example, when the transmission data is "1", lower electrode 8c is set to "1" at the rising timing of transmission clock CLK and an upward-going pulse is conveyed to upper electrode 8d according to the data transition of lower electrode 8c from "½" to "1". Lower electrode 8c is set to "½" at the falling timing of transmission clock CLK and a downward-going pulse is conveyed to upper electrode 8d according to the data transition of lower electrode 8c from "1" to "½". Conversely, when the transmission data is "0", lower electrode 8c is set to "0" at the rising timing of transmission clock CLK, and a downward-going pulse is conveyed to upper electrode 8d according to the data transition of lower electrode 8c from "½" to "0". Lower electrode 8c is set to "½" at the falling timing of transmission clock CLK and an upward-going pulse is conveyed to upper electrode 8d according to the data transition of lower electrode 8c from "0" to "½". In this way, a transmission data of "1" or "0" is converted to an upward-going pulse or a downward-going pulse at upper electrode 8d at the rising timing of transmission clock CLK. The transmission data is thus conveyed to upper electrode 8d.

On the other hand, in a receiving-side circuit including upper electrode 8d, switch 17C operates according to reception clock CLK. When reception clock CLK is at a high level, the data of upper electrode 8d is received by a reception buffer or by a sampling latch. When reception clock CLK is at a low level, a half voltage is applied to upper electrode 8d, thereby resetting the voltage at the upper electrode.

FIG. 21 illustrates a sampling latch-type receiver circuit as an example of receiver circuit 19.

A capacitive-coupling voltage is applied to terminal "in", and a half voltage is applied to the other input terminal forming a differential pair together with terminal "in". This sampling latch circuit operates in such a manner that when a CLK input is at a low level, all four wire connections of the drain terminals of nMOSs that are connected to wire connections "out" and "outb", terminal "in" and the half-voltage input terminal are pre-charged to a power supply voltage. At this time, if the CLK input changes to a high level, then the receiver circuit senses a difference between voltages that are input to the "in" terminal and the half-voltage terminal and outputs the result of sensing as differential outputs "out" and "outb".

Although the present invention has been described with reference to the exemplary embodiments, the present invention is not limited to the above-described exemplary embodiments. Various modifications that can be understood to those skilled in the art may be made to the constitution and details of the present invention within the scope thereof.

This application is the National Phase of PCT/JP2008/053612, filed Feb. 29, 2008, which claims the right of priority based on Japanese Patent Application No. 2007-060352, filed on Mar. 9, 2007, the entire content of which is incorporated herein by reference.

The invention claimed is:

1. A semiconductor chip including: a silicon substrate on which a first signal transmission circuit and a first changeover switch are formed;
   an interconnection layer formed on said silicon substrate; and
   a first capacitive-coupling upper electrode formed on said interconnection layer; said semiconductor chip comprising:
   a first capacitive-coupling lower electrode that is formed on the rear surface of said silicon substrate through a first via hole that penetrates said silicon substrate, wherein said first capacitive-coupling upper electrode is directly connected to said first signal transmission circuit, and wherein said first capacitive-coupling lower electrode is connected to the first signal transmission circuit through the first via hole and said first changeover switch.

2. The semiconductor chip according to claim 1, further comprising a second changeover switch that is formed on said silicon substrate, wherein said first capacitive-coupling upper electrode is connected to said first signal transmission circuit through said second changeover switch.

3. The semiconductor chip according to claim 2, further comprising a third changeover switch that is formed on said silicon substrate, wherein said first capacitive-coupling upper electrode is connected to said first capacitive-coupling lower electrode through said third changeover switch and the first via hole.

4. The semiconductor chip according to claim 1, further comprising a fourth changeover switch that is formed on said silicon substrate, and a second capacitive-coupling lower electrode that is formed on the rear surface of said silicon substrate through a second via hole that penetrates said silicon substrate, wherein said second capacitive-coupling lower electrode is connected to the first signal transmission circuit through the second via hole and through said fourth changeover switch.

5. The semiconductor chip according to claim 4, further comprising: a second signal transmission circuit, a fifth changeover switch and a sixth changeover switch that are formed on said silicon substrate, and a second capacitive-coupling upper electrode that is formed on the interconnection layer, wherein said second capacitive-coupling upper electrode is directly connected to the second signal transmission circuit, wherein said first capacitive-coupling lower electrode is connected to the second signal transmission circuit through the first via hole and through said fifth changeover switch, and wherein the second capacitive-coupling lower electrode is connected to the second signal transmission circuit through the second via hole and through said sixth changeover switch.

6. The semiconductor chip according to claim 5, further comprising: a seventh changeover switch, an eighth changeover switch, a ninth changeover switch and a tenth changeover switch that are formed on said silicon substrate, wherein said first capacitive-coupling upper electrode is connected to the first signal transmission circuit through said seventh changeover switch, wherein the first capacitive-coupling upper electrode is connected to the second signal transmission circuit through said eighth changeover switch, wherein the second capacitive-coupling upper electrode is connected to the first signal transmission circuit through said ninth changeover switch, and wherein the second capacitive-coupling upper electrode is connected to the second signal transmission circuit through said tenth changeover switch.

7. The semiconductor chip according to claim 1, further comprising an amplifier that is connected in series with each of said changeover switches.

8. The semiconductor chip according to claim 7, wherein an amplifier that has a switch is used in place of each pair of said changeover switches and said amplifiers.

9. A semiconductor device including a semiconductor chip including: a silicon substrate on which a first signal transmission circuit and a first changeover switch are formed; an interconnection layer formed on said silicon substrate; and a first capacitive-coupling upper electrode formed on the interconnection layer; said semiconductor, device comprising a first capacitive-coupling lower electrode that is formed on the rear surface of said silicon substrate through a first via hole that penetrates said silicon substrate, wherein said first capacitive-coupling upper electrode is directly connected to the first signal transmission circuit, and wherein said first capacitive-coupling lower electrode is connected to the first signal transmission circuit through the first via hole and through the first changeover switch.

10. The semiconductor device according to claim 9, further comprising a second changeover switch that is formed on said silicon substrate, wherein said first capacitive-coupling upper electrode is connected to the first signal transmission circuit through said second changeover switch.

11. The semiconductor device according to claim 10, further comprising a third changeover switch that is formed on said silicon substrate, wherein the first capacitive-coupling upper electrode is connected to said first capacitive-coupling lower electrode through said third changeover switch and through the first via hole.

12. The semiconductor device according to claim 9, further comprising a fourth changeover switch that is formed on the silicon substrate, and a second capacitive-coupling lower electrode that is formed on the rear surface of said silicon substrate through a second via hole that penetrates said silicon substrate, wherein said second capacitive-coupling lower electrode is connected to the first signal transmission circuit through the second via hole and through said fourth changeover switch.

13. The semiconductor device according to claim 12, further comprising a second signal transmission circuit, a fifth changeover switch and a sixth changeover switch that are formed on the silicon substrate, and a second capacitive-coupling upper electrode that is formed on the interconnection layer, wherein the second capacitive-coupling upper electrode is directly connected to the second signal transmission circuit, wherein said first capacitive-coupling lower electrode is connected to the second signal transmission circuit through the first via hole and through said fifth changeover switch, and wherein said second capacitive-coupling lower electrode is connected to the second signal transmission circuit through the second via hole and through said sixth changeover switch.

14. The semiconductor device according to claim 13, further comprising a seventh changeover switch, an eighth changeover switch, a ninth changeover switch and a tenth changeover switch that are formed on the silicon substrate, wherein said first capacitive-coupling upper electrode is connected to the first signal transmission circuit through said seventh changeover switch, wherein the first capacitive-coupling upper electrode is connected to the second signal transmission circuit through said eighth changeover switch, wherein the second capacitive-coupling upper electrode is connected to the first signal transmission circuit through said ninth changeover switch, and wherein the second capacitive-coupling upper electrode is connected to the second signal transmission circuit through said tenth changeover switch.

15. The semiconductor device according to claim 9, further comprising an amplifier that is connected in series with each of said changeover switches.

16. The semiconductor device according to claim 15, wherein an amplifier that has a switch is used in place of each pair of said changeover switches and the amplifiers.

* * * * *